(12) United States Patent
Benedict et al.

(10) Patent No.: US 10,477,672 B2
(45) Date of Patent: Nov. 12, 2019

(54) SINGLE ENDED VIAS WITH SHARED VOIDS

(71) Applicant: Hewlett Packard Enterprise Development LP, Houston, TX (US)

(72) Inventors: Melvin K. Benedict, Houston, TX (US); Karl J. Bois, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 11 days.

(21) Appl. No.: 15/882,649

(22) Filed: Jan. 29, 2018

(65) Prior Publication Data

US 2019/0239338 A1 Aug. 1, 2019

(51) Int. Cl.
*H05K 1/02* (2006.01)
*H05K 1/11* (2006.01)
*H05K 1/18* (2006.01)
*H01R 12/71* (2011.01)

(52) U.S. Cl.
CPC ......... *H05K 1/0216* (2013.01); *H01R 12/716* (2013.01); *H05K 1/115* (2013.01); *H05K 1/18* (2013.01); *H05K 2201/095* (2013.01); *H05K 2201/10159* (2013.01)

(58) Field of Classification Search
None
See application file for complete search history.

(56) References Cited

U.S. PATENT DOCUMENTS

| | | | | |
|---|---|---|---|---|
| 4,636,919 A | * | 1/1987 | Itakura | H05K 1/0289 174/261 |
| 5,557,844 A | * | 9/1996 | Bhatt | H01L 23/5384 156/89.18 |
| 5,784,262 A | * | 7/1998 | Sherman | H05K 1/114 174/261 |
| 6,150,729 A | * | 11/2000 | Ghahghahi | H01L 23/49827 257/698 |
| 6,373,139 B1 | * | 4/2002 | Clark | H01L 23/49838 257/737 |
| 6,767,252 B2 | | 7/2004 | McGrath et al. | |
| 6,787,710 B2 | * | 9/2004 | Uematsu | H05K 1/115 174/255 |
| 6,798,666 B1 | * | 9/2004 | Alexander | H05K 1/0234 174/260 |
| 6,941,649 B2 | * | 9/2005 | Goergen | H05K 1/0218 174/258 |

(Continued)

OTHER PUBLICATIONS

Baldwin, M. et al., "New Techniques to Address Layout Challenges of High-speed Signal Routing," (Web Page), 2016, https://www.cadence.com/content/dam/cadence-www/global/en_US/documents/tools/pcb-design-analysis/pcb-west-2016-new-techniques-address-layout-challenges-high-speed-routing-cp.pdf.

*Primary Examiner* — Dimary S Lopez Cruz
*Assistant Examiner* — Muhammed Azam
(74) *Attorney, Agent, or Firm* — Hewlett Packard Enterprise Patent Department

(57) ABSTRACT

An electronic device includes a printed circuit board. The printed circuit board includes a plurality of different signaling planes and a plurality of different reference planes. A single ended via interconnects the plurality of different signaling planes. A return via interconnects the plurality of different reference planes. The electronic device includes a shared void that includes the single ended via and the return via.

17 Claims, 2 Drawing Sheets

(56) References Cited

U.S. PATENT DOCUMENTS

| | | | | |
|---|---|---|---|---|
| 7,030,712 B2* | 4/2006 | Brunette | H05K 1/0222 | 333/238 |
| 7,045,719 B1* | 5/2006 | Alexander | H05K 1/0251 | 174/262 |
| 7,066,744 B2* | 6/2006 | Kameyama | H01R 13/6471 | 439/108 |
| 7,081,672 B1* | 7/2006 | Govind | H01L 23/49827 | 174/262 |
| 7,096,450 B2* | 8/2006 | Gill | G06F 17/5077 | 174/262 |
| 7,096,555 B2* | 8/2006 | Tourne | H05K 3/0047 | 174/260 |
| 7,141,742 B2* | 11/2006 | Barr | H05K 1/0251 | 174/262 |
| 7,239,526 B1* | 7/2007 | Bibee | H05K 1/0219 | 361/788 |
| 7,239,527 B1* | 7/2007 | Goergen | H05K 1/0225 | 361/788 |
| 7,249,337 B2* | 7/2007 | Gisin | G06F 17/5036 | 257/678 |
| 7,347,701 B2* | 3/2008 | Daly | H01R 43/0249 | 439/68 |
| 7,448,909 B2* | 11/2008 | Regnier | H05K 1/0222 | 439/607.05 |
| 7,548,432 B2* | 6/2009 | Lu | H01G 4/232 | 174/255 |
| 7,705,246 B1* | 4/2010 | Pritchard | H05K 1/0222 | 174/262 |
| 7,705,695 B2* | 4/2010 | Kushta | H01P 1/2039 | 333/204 |
| 7,709,747 B2* | 5/2010 | Morlion | H05K 1/114 | 174/262 |
| 7,897,880 B1* | 3/2011 | Goergen | H05K 1/0237 | 174/261 |
| 8,033,015 B2* | 10/2011 | Kashiwakura | H01L 23/50 | 29/830 |
| 8,242,384 B2* | 8/2012 | Cases | H05K 1/0251 | 174/250 |
| 8,248,816 B2* | 8/2012 | Fung | H05K 1/0251 | 174/255 |
| 8,536,464 B2* | 9/2013 | Kushta | H05K 1/0245 | 174/261 |
| 8,542,494 B2* | 9/2013 | Mutnury | H05K 1/024 | 361/748 |
| 8,889,999 B2* | 11/2014 | Thurairajaratnam | H05K 1/024 | 174/261 |
| 8,957,325 B2* | 2/2015 | Hidaka | H05K 1/116 | 174/262 |
| 9,293,405 B2* | 3/2016 | Baba | H01L 21/563 | |
| 9,379,079 B1* | 6/2016 | Fang | H01L 23/5283 | |
| 9,433,078 B2 | 8/2016 | Duvanenko | | |
| 9,775,231 B2* | 9/2017 | Cartier, Jr. | H05K 1/025 | |
| 9,814,145 B2* | 11/2017 | Hardin | H05K 1/0222 | |
| 9,832,899 B1* | 11/2017 | Brown | G01R 1/0466 | |
| 2005/0161254 A1* | 7/2005 | Clink | H05K 1/0245 | 174/262 |
| 2005/0231927 A1* | 10/2005 | Masuyama | H05K 1/115 | 361/783 |
| 2006/0042828 A1* | 3/2006 | Matsuo | H05K 1/0218 | 174/255 |
| 2006/0043572 A1* | 3/2006 | Sugimoto | H05K 1/0251 | 257/700 |
| 2006/0090933 A1* | 5/2006 | Wig | H05K 1/0216 | 174/262 |
| 2006/0151205 A1* | 7/2006 | Lim | H05K 1/0231 | 174/260 |
| 2006/0158280 A1* | 7/2006 | Jow | H01L 23/66 | 333/33 |
| 2006/0185890 A1* | 8/2006 | Robinson | H05K 1/0216 | 174/255 |
| 2006/0232301 A1* | 10/2006 | Morlion | H05K 1/114 | 326/126 |
| 2006/0266549 A1* | 11/2006 | Lin | H05K 1/0216 | 174/262 |
| 2007/0089292 A1* | 4/2007 | Tourne | H05K 1/114 | 29/852 |
| 2007/0091581 A1* | 4/2007 | Gisin | H05K 1/023 | 361/782 |
| 2007/0136618 A1* | 6/2007 | Ohsaka | G06F 1/188 | 713/323 |
| 2008/0017411 A1* | 1/2008 | Chen | H05K 1/0251 | 174/262 |
| 2008/0088007 A1* | 4/2008 | Quach | H01L 23/66 | 257/691 |
| 2008/0121421 A1* | 5/2008 | Kashiwakura | H05K 1/0251 | 174/262 |
| 2008/0266829 A1* | 10/2008 | Tang | H01L 23/5225 | 361/816 |
| 2009/0045889 A1* | 2/2009 | Goergen | H05K 1/0216 | 333/175 |
| 2009/0049414 A1* | 2/2009 | Mutnury | G06F 17/5068 | 716/132 |
| 2010/0319980 A1* | 12/2010 | Kim | H05K 1/0236 | 174/266 |
| 2011/0011637 A1* | 1/2011 | Yoshinaga | H05K 1/0216 | 174/262 |
| 2011/0094786 A1* | 4/2011 | Liu | H05K 1/0251 | 174/262 |
| 2012/0221990 A1* | 8/2012 | Dai | G06F 17/5045 | 716/112 |
| 2013/0077268 A1* | 3/2013 | Brunker | H05K 1/024 | 361/752 |
| 2013/0112465 A1* | 5/2013 | Duvanenko | H05K 1/0216 | 174/260 |
| 2014/0118962 A1* | 5/2014 | Sabavat | H05K 1/0224 | 361/748 |
| 2014/0209370 A1* | 7/2014 | Minich | G09B 23/183 | 174/266 |
| 2014/0326495 A1* | 11/2014 | Paniagua | H05K 1/0251 | 174/266 |
| 2015/0373831 A1* | 12/2015 | Rogers | H01L 23/18 | 429/121 |
| 2016/0150645 A1* | 5/2016 | Gailus | H05K 1/0216 | 174/266 |
| 2016/0308284 A1* | 10/2016 | Forslund | H01Q 21/0006 | |
| 2017/0265296 A1* | 9/2017 | Charbonneau | H05K 1/0245 | |
| 2017/0318665 A1* | 11/2017 | Bois | H05K 1/0245 | |
| 2018/0054892 A1* | 2/2018 | Tourne | H05K 3/403 | |
| 2018/0070439 A1* | 3/2018 | Charbonneau | H05K 1/0225 | |

* cited by examiner

SINGLE ENDED VIAS WITH SHARED VOIDS

BACKGROUND

Electrical components, such as memory devices, can be mounted on a printed circuit board (PCB). The PCB may include multiple signaling lines that can travel through different layers of the PCB. The different layers of the PCB may be connected with signal vias, or connections, that transmit the electrical signal between the different layers of the PCB.

The signals in the PCB associated with memory devices have a return signal that is associated (e.g., explicit or virtual) with each electrical signal. The return signal may be transported by a ground plane or signal that is in a layer of the PCB just below the layer that carries the electrical signal. The return signal may be transmitted with return vias, or connections, that transmit the return signal between the different layers of the PCB.

DETAILED DESCRIPTION

Examples described herein provide a printed circuit board (PCB) design for an electronic device that has a shared void for a single ended via and a return via. As discussed above, the PCB may include a signal via and a return via. In a single ended signal design the PCB may include separate voids for the signal via and the return via. However, as the frequency is increased this design can lead to increased interference and signal degradation. In addition, the number of separate voids can require a larger design footprint.

For example, singled ended voids that are not shared have inherent stray horizontal capacitance to the group and power planes with the via being vertical. As the frequency increases, the electrical effect of the capacitance will gradually change the impedance of the via. To minimize the issue of the capacitance with increasing frequency, the void around the signal line can be increased. However, this consumes a lot of the ground plane and power layer area and can make the design moot.

Without the void in the reference plane layers, the signal vias would short all of the reference planes. Current designs use separate voids for the single ended via and the return via. For example, in current designs, the single ended via may have a void, the return via may have a void and there may be some PCB material between the voids.

The examples of the present disclosure provide a shared void for the single ended via and the return via. In other words, looking from a top view of the vias, the shared void has no separate interface between the single ended via and the return via. In addition, the shared void contains no metallic interconnections with other signaling planes other than the signaling planes associated with the single ended via through the cross-section of the entire PCB.

The shared voids described in the present disclosure, unlike the unshared voids of singled ended vias of previous designs, let the signal use the adjacent ground more efficiently as a current return. In doing so, the current return may not be shared to other signal lines since the preferred path may be that of the ground present in the same void as its signal.

Figure 1:
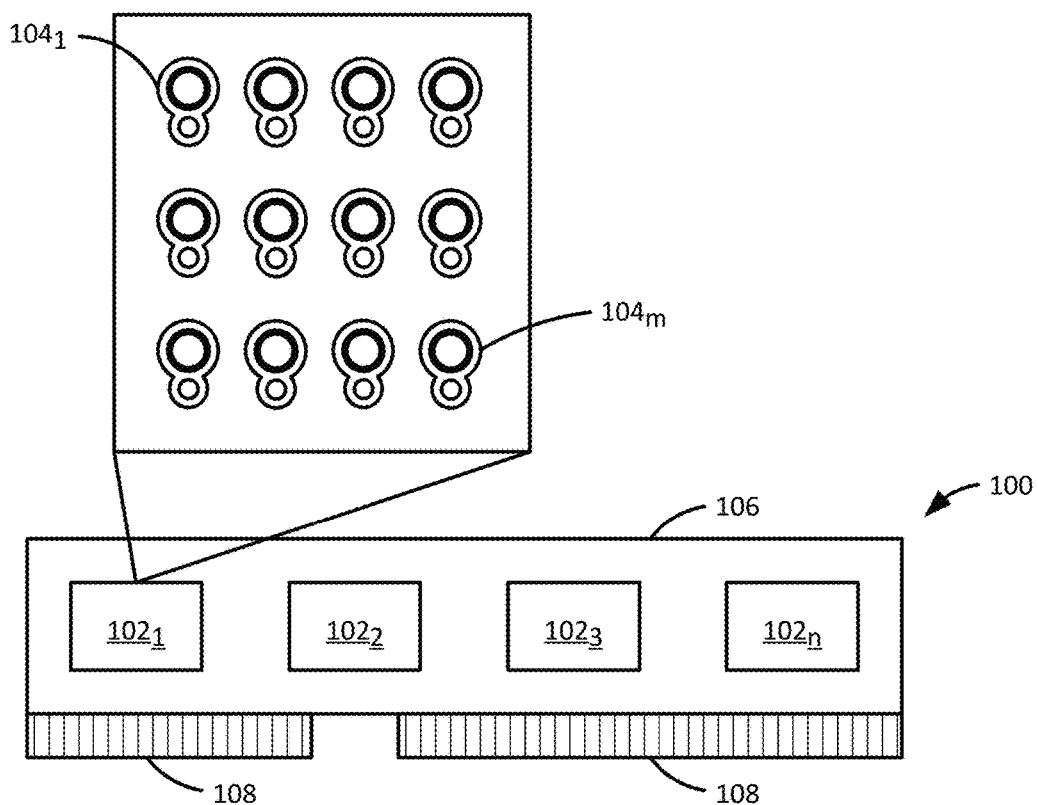
FIG. 1 is a block-diagram of an example apparatus of the present disclosure.

FIG. 1 illustrates an example apparatus 100 of the present disclosure. The apparatus 100 may include a printed circuit board 106 having a plurality of electronic devices $102_1$ to $102_n$ (hereinafter referred to individually as an electronic device 102 or collectively as electronic devices 102). In one example, the apparatus 100 may include interfaces 108 to connect to a mother board or other type of interface on a computing device.

In one example, the electronic devices 102 may be memory devices. The electronic devices 102 may include a plurality of single ended signaling structures $104_1$ to $104_m$ (hereinafter referred to individually as a single ended signaling structure 104 or collectively as single ended signaling structures 104) of the present disclosure that form the electronic devices 102. As discussed in further detail below, the single ended signaling structure 104 may include a signaling via and a reference via that are in the same shared void. In other words, the signaling via and the reference via of the single ended signaling structure 104 do not have separate voids.

The shared void may be created on layers with no connection. As a result, signal coupling is maintained. In other words, the shared void on layers with a signaling via and a reference via may maintain a uniform coupling (e.g., uniform impedance) during layer transitions and improve signaling.

Figure 2:
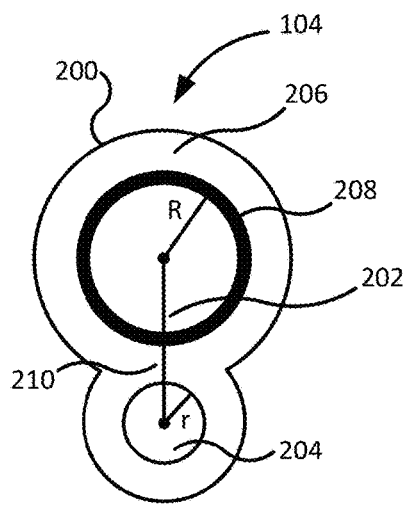
FIG. 2 is a top view of an example electronic device of the present disclosure.

FIG. 2 illustrates a top view of the single ended signaling structure 104. In one example, the single ended signaling structure 104 may be formed in a printed circuit board (PCB) 200. The PCB 200 may be constructed from conductive materials such as copper and dielectric materials (e.g., non-conductive). In one example, the PCB 200 may include a silkscreen layer, a soldermask layer, a conductive layer (e.g., copper) that the vias travel through and the voids are etched out of, and a substrate layer (e.g., fire retardant 4 material).

Figure 3:
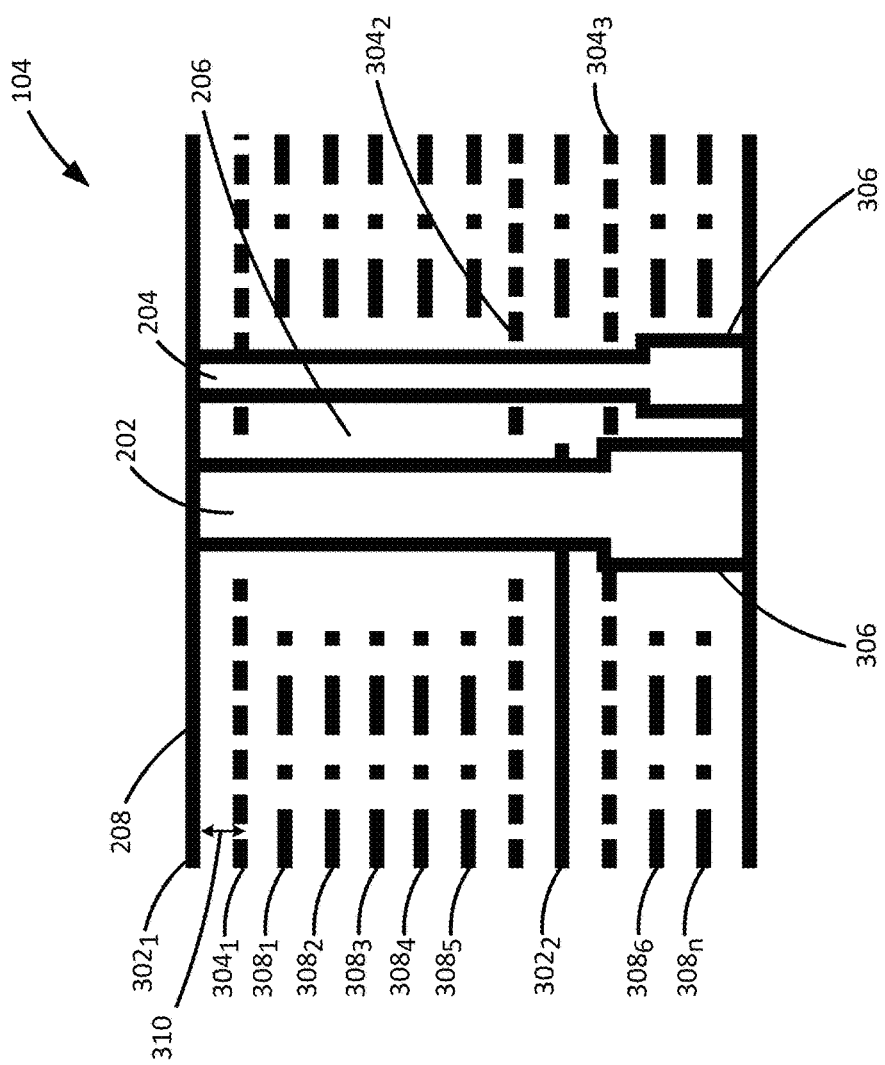
FIG. 3 is a cross-sectional view of an example electronic device of the present disclosure.

In one example, the single ended signaling structure 104 may include a single ended via 202 and a return via 204. The single ended via 202 may be the via that carries the signal. The return via 204 may be the via that carries the current in an opposite direction relative to the signal carried by the single ended via 202 to create the electrical circuit. In one example, the single ended signaling structure 104 may include a return via 204 at locations where a signal transitions between layers, as shown in FIG. 3 below.

In one example, the single ended via 202 may also include a micro-strip 208. The micro-strip 208 may be a metallic or conductive material that carries an electronic signal through the single ended via 202.

As illustrated in FIG. 2, the single ended via 202 may have a radius "R" and the return via 204 may have a radius of "r". The radius "R" and the radius "r" may be different lengths or the radius "R" and the radius "r" may be the same length.

In one example, the singled ended via 202 and the return via 204 may be in a shared void 206. A void, also known as an anti-pad, in the PCB 200 may be a shape in the reference plane layers. The void may be created by etching away PCB material (e.g., metal used to fabricate the PCB 200) out of what would normally be a solid reference plane to prevent connection.

According to the present disclosure the shared void 206 may be one continuous void around the single ended via 202 and the return via 204. In other words, the shared void 206 contains both the single ended via 202 and the return via 204. Said yet another way, the singled ended via 202 and the return via 204 do not have different respective voids. Rather, the shared void 206 is created by etching material of the PCB around both the single ended via 202 and the return via 204 in a particular layer, or layers, of the PCB 200.

In one example, the design of the single ended signaling structure 104 places the single ended via 202 and the return via 204 as close together as operationally possible using the shared void 206. In other words, the return via 204 may be as close as possible to the single ended via 202 to maintain the transmission line characteristics of a signal traveling through the micro-strip 208 of single ended via 202. In one example, a distance 210 between a center of the single ended via 202 and the return via 204 may be less than the radius "R" of the single ended via 202 plus the radius "r" of the return via 204 plus a constant "c" that is equal to a spacing (e.g., 310 of FIG. 3) between a signaling plane (e.g., $302_1$, of FIG. 3) and a reference plane (e.g., $304_1$, of FIG. 3) in the PCB 200 (e.g., distance is less than (R +r +c)). In one example, the constant "c" may be approximately 3-5 millimeters (mm).

FIG. 3 illustrates an example cross-sectional view of the single ended signaling structure 104. As noted above, the single ended signaling structure 104 may be formed in the PCB 200. FIG. 3 illustrates the single ended via 202 that runs vertically through the PCB 200 and the return via 204 that also runs vertically through the PCB 200.

In one example, the single ended via 202 and the return via 204 may be formed with a back drill feature 306. The back drill feature 306 may be formed by removal of the unused portion, or stub, of copper barrel from a thru-hole in the PCB 200 using a back drilling process. Minimizing the stubs may remove a source of impedance discontinuities and signal reflections that may occur as data rates of the electronic device 102 increases. In the present disclosure, the unused portion, or stub, within the return via 204 may also be removed with the back drill feature 306. In other words, both the single ended via 202 and the return via 204 may have the back drill feature 306 to remove the stub. The back drill feature of the single ended via 202 may be higher than the back drill feature 306 of the return via 204 due to back drill tolerances. The back drill feature of the single ended via 202 may terminate at approximately planar with the lower reference plane $304_3$.

As noted above, a return via 204 may be located at locations where a signal transitions between layers or signaling planes. For example, the PCB 200 may include a plurality of different signaling planes and a plurality of different reference planes. In one example, plurality of different signaling planes may include a signaling plane $302_1$ and $302_2$. For example, the signaling plane $302_1$ may be a top most signaling plane. The signaling plane $302_2$ may be located below the signaling plane $302_1$ that is the top most signaling plane. The signaling planes may be comprised of metallic or conductive materials. For example, the signaling plane $302_1$ and $302_2$ may be formed by the micro-strip 208.

The single ended via 202 may interconnect the two signaling planes $302_1$ and $302_2$. Although two signaling planes $302_1$ and $302_2$ are illustrated in FIG. 3, it should be noted that the single ended via 202 may interconnect more than two signaling planes.

The PCB 200 may include a plurality of different reference planes. The different reference planes may be associated with the different signaling planes $302_1$ and $302_2$.

In one example, the plurality of different reference planes may include reference planes $304_1$, $304_2$, and $304_3$. The reference planes $304_1$, $304_2$, and $304_3$ may be planes or layers that are used by the signal line to close the current loop. The term "reference plane" may be used to include ground plane or a power plane as some designs may be a ground referenced and others may be power referenced. The reference planes $304_1$, $304_2$, and $304_3$ may include any metallic or conductive materials. The reference plane $304_1$ may be located below the top most signaling plane $302_1$. The reference plane $304_2$ may be above the signaling plane $302_2$ and the reference plane $304_3$ may be below the signaling plane $302_2$. In other words, the signaling plane $302_2$ may be located between the reference planes $304_2$ and $304_3$.

The return via 204 may interconnect the reference planes $304_1$, $304_2$, and $304_3$. In other words, the return via 204 may interconnect at least two different reference planes. Although three reference planes $304_1$, $304_2$, and $304_3$ are illustrated in FIG. 3, it should be noted that the return via 204 may interconnect more than two reference planes.

FIG. 3 also illustrates the shared void 206. The shared void 206 may be a vertical void that is free from any metallic connections through an entire cross-section of the shared void 206. The shared void 206 may be created in layers of the PCB 200 that have no connection to the single ended via 202. In other words, the shared void 206 may create a space that may prevent the single ended via 202 from contacting any additional signaling planes (e.g., signaling planes other than signaling planes $302_1$ and $302_2$) located in layers along a cross-section of the shared void 206.

For example, FIG. 3 illustrates additional non-contacting signaling planes $308_1$ to $308_n$. The shared void 206 may be created in the PCB 200 to prevent the additional non-contacting signaling planes $308_1$ to $308_n$ from contacting the single ended via 202.

The reference planes $304_1$, $304_2$, and $304_3$ may be the reference planes of the signaling planes $302_1$ and $302_2$ of the single ended via 202. No other planes run through the cross-section of the shared void 206. As shown in the top view illustrated in FIG. 2 and the cross-sectional view illustrated in FIG. 3, the shared void 206 may include the single ended via 202 and the return via 204. In addition, the shared void 206 may be created vertically through multiple layers of the PCB 200, as shown in FIG. 3. For example, the vertical cross-section of the shared void 206 may have a distance of a plurality of layers of the PCB 200 between the single ended via 202 and the return via 204.

As noted above, the shared void 206 may allow a return current to efficiently use the return via 204. The shared void 206 causes the return current to prefer the return via 204 over other signaling planes in the PCB 200. As a result, signaling is improved.

In one example, all unused pads of additional signaling planes or reference planes may be removed. For example, FIG. 3 illustrates other signaling planes and reference planes. However, some of the reference planes are not connected to the single ended via 202. Thus, the via pads associated with the reference planes associated with the unused or unconnected signaling planes may be removed and are not connected to the return via 204.

The electronic device 102 of the present disclosure provides an improved single ended via design. For example, the electronic device 102 of the present disclosure may have a single ended signaling structure 104 that uses a shared via 206. The shared via 206 may contain both the single ended via 202 and the return via 204, as described above.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. An electronic device, comprising:
a printed circuit board comprising a plurality of different signaling planes and a plurality of different reference planes;
a single ended via to interconnect the plurality of different signaling planes;
a return via to interconnect the plurality of different reference planes; and
a shared void that surrounds the single ended via and the return via,
wherein a distance between a center of the single ended via and a center of the return via comprises less than a radius of the single ended via plus a radius of the return via plus a spacing between a signaling plane of the different signaling planes and a reference plane of the different reference planes.

2. The electronic device of claim 1, wherein the shared void is a vertical void.

3. The electronic device of claim 1, wherein the shared void is free from any metallic connections through an entire cross-section of the shared void.

4. The electronic device of claim 1, wherein the shared void prevents the single ended via from contacting additional signaling planes located in layers along a cross-section of the shared void.

5. The electronic device of claim 1, wherein single ended via includes a back drill feature to remove a stub.

6. The electronic device of claim 1, wherein the return via includes a back drill feature to remove a stub.

7. The electronic device of claim 1, where a total number of vias in the shared void, including the single ended via and the return via, is two.

8. The electronic device of claim 1, wherein the plurality of different reference planes comprises a first reference plane below a top most signaling plane, a second reference plane above a signaling plane that is below the top most signaling plane, and a third reference plane below the signaling plane that is below the top most signaling plane.

9. A printed circuit board, comprising:
a single ended via to interconnect at least two different signaling planes;
a return via to interconnect at least two different reference planes; and
a shared void that surrounds the single ended via and the return via,
wherein a distance between a center of the single ended via and a center of the return via comprises less than a radius of the single ended via plus a radius of the return via plus a spacing between a signaling plane of the at least two different signaling planes and a reference plane of the at least two different reference planes.

10. The printed circuit board of claim 9, wherein the shared void causes a return current to prefer the return via over other signaling planes.

11. The printed circuit board of claim 10, wherein the shared void is formed in layers of the printed circuit board with no connection to the single ended via.

12. The printed circuit board of claim 9, wherein the shared void is formed by etching material of the printed circuit board around the single ended via and the return via.

13. The printed circuit board of claim 9, wherein a vertical cross-section of the shared void comprises a plurality of layers of the printed circuit board between the single ended via and the return via.

14. An apparatus, comprising:
a printed circuit board (PCB);
an interface coupled to the PCB to connect to an interface on a computing device; and
a plurality of electronic devices coupled to the PCB, wherein each one of the electronic devices comprises a plurality of shared voids, wherein each one of the plurality of shared voids surrounds a single pair of a single ended via and a return via,
wherein the single ended via interconnects a plurality of different signaling planes of the PCB,
the return via interconnects a plurality of different reference planes of the PCB, and
a distance between a center of the single ended via and a center of the return via comprises less than a radius of the single ended via plus a radius of the return via plus a spacing between a signaling plane of the plurality of different signaling planes and a reference plane of the plurality of different reference planes.

15. The apparatus of claim 14, wherein the plurality of different reference planes are associated with the plurality of different signaling planes.

16. The apparatus of claim 14, wherein the plurality of different signaling planes comprises a top most signaling plane and a signaling plane below the top most signaling plane.

17. The apparatus of claim 16, wherein the plurality of different reference planes comprises a first reference plane below the top most signaling plane, a second reference plane above the signaling plane that is below the top most signaling plane, and a third reference plane below the signaling plane that is below the top most signaling plane.

* * * * *